(12) United States Patent
Abe et al.

(10) Patent No.: US 10,633,564 B2
(45) Date of Patent: Apr. 28, 2020

(54) THERMALLY AND ELECTRICALLY CONDUCTIVE ADHESIVE COMPOSITION

(71) Applicant: TANAKA KIKINZOKU KOGYO K.K., Tokyo (JP)

(72) Inventors: Shintaro Abe, Kanagawa (JP); Rikia Furusho, Kanagawa (JP)

(73) Assignee: TANAKA KIKINZOKU KOGYO K.K., Tokyo (JP)

( * ) Notice: Subject to any disclaimer, the term of this patent is extended or adjusted under 35 U.S.C. 154(b) by 0 days.

(21) Appl. No.: 15/313,206

(22) PCT Filed: May 28, 2015

(86) PCT No.: PCT/JP2015/065482
§ 371 (c)(1),
(2) Date: Nov. 22, 2016

(87) PCT Pub. No.: WO2015/182730
PCT Pub. Date: Dec. 3, 2015

(65) Prior Publication Data
US 2017/0210951 A1    Jul. 27, 2017

(30) Foreign Application Priority Data

May 29, 2014    (JP) ................................ 2014-111769

(51) Int. Cl.
| | |
|---|---|
| *C09J 9/02* | (2006.01) |
| *C09J 163/04* | (2006.01) |
| *H01L 23/00* | (2006.01) |
| *C09J 11/08* | (2006.01) |
| *C09K 5/14* | (2006.01) |
| *C09J 163/00* | (2006.01) |
| *C09J 11/04* | (2006.01) |
| *C08G 59/50* | (2006.01) |
| *C09J 11/06* | (2006.01) |
| *H01L 23/373* | (2006.01) |
| *C09J 121/00* | (2006.01) |
| *H01B 1/22* | (2006.01) |
| *H01B 1/02* | (2006.01) |
| *C08G 59/62* | (2006.01) |
| *C08K 3/08* | (2006.01) |

(52) U.S. Cl.
CPC .............. *C09J 9/02* (2013.01); *C08G 59/504* (2013.01); *C08G 59/5033* (2013.01); *C08G 59/621* (2013.01); *C09J 11/04* (2013.01); *C09J 11/06* (2013.01); *C09J 11/08* (2013.01); *C09J 121/00* (2013.01); *C09J 163/00* (2013.01); *C09J 163/04* (2013.01); *C09K 5/14* (2013.01); *H01B 1/02* (2013.01); *H01B 1/22* (2013.01); *H01L 23/3737* (2013.01); *H01L 24/29* (2013.01); *C08K 2003/0806* (2013.01); *H01L 2224/2929* (2013.01); *H01L 2224/29298* (2013.01); *H01L 2224/29339* (2013.01); *H01L 2924/0665* (2013.01); *H01L 2924/07811* (2013.01); *H01L 2924/12041* (2013.01); *H01L 2924/2075* (2013.01); *H01L 2924/20751* (2013.01)

(58) Field of Classification Search
None
See application file for complete search history.

(56) References Cited

U.S. PATENT DOCUMENTS

| | | | | |
|---|---|---|---|---|
| 2003/0190480 | A1* | 10/2003 | Kutsuna | C08G 59/52 428/416 |
| 2012/0177930 | A1 | 7/2012 | Henckens | |
| 2015/0247067 | A1* | 9/2015 | Iseda | H01B 1/22 428/414 |

FOREIGN PATENT DOCUMENTS

| | | | |
|---|---|---|---|
| CN | 101747855 A | 6/2010 | |
| CN | 101935510 A | 1/2011 | |
| CN | 102408856 A | 4/2012 | |
| CN | 102471651 A | 5/2012 | |
| CN | 102634312 A | 8/2012 | |
| CN | 102174306 B | 9/2013 | |
| EP | 1032038 A2 * | 8/2000 | ............... C09J 9/02 |
| JP | H06-322350 A | 11/1994 | |
| JP | 2000-136638 A | 5/2000 | |
| JP | 2000239636 A | 9/2000 | |
| JP | 2001-002892 A | 1/2001 | |

(Continued)

OTHER PUBLICATIONS

EP, Supplementary European Search Report and European Search Opinion for EP application No. 15799331.2, dated Jan. 4, 2018.

(Continued)

*Primary Examiner* — Tanisha Diggs
(74) *Attorney, Agent, or Firm* — Orrick, Herrington & Sutcliffe LLP; Joseph A. Calvaruso; K. Patrick Herman

(57) ABSTRACT

The present invention relates to a thermally and electrically conductive adhesive composition, which includes (A) an electrically conductive filler, (B) an epoxy resin, (C) a reactive diluent, and (D) a curing agent, wherein the component (A) is a silver powder having an average particle diameter of 1 to 10 μm, the component (B) has two or more epoxy functional groups and aromatic rings in each molecule, the component (C) is a compound having two or more glycidyl ether functional groups in an aliphatic hydrocarbon chain and also having a molecular weight of 150 to 600, and the component (D) is a compound having two or more phenol functional groups in each molecule, a compound having two or more aniline functional groups in each molecule, or a mixture of these compounds, and the content of each of the components (A), (B), (C), and (D) is within a specific range.

3 Claims, No Drawings

(56) References Cited

FOREIGN PATENT DOCUMENTS

| | | | | |
|---|---|---|---|---|
| JP | 2007197498 A | 8/2007 | | |
| JP | 2008186590 A | 8/2008 | | |
| JP | 2009084510 A | 4/2009 | | |
| JP | 2009102603 A * | 5/2009 | ............ | H01L 24/32 |
| JP | 2009-120826 * | 6/2009 | | |
| JP | 2009-286824 A | 12/2009 | | |
| JP | 2012532942 T | 12/2012 | | |
| JP | 2013175559 A | 9/2013 | | |
| JP | 2013214733 A | 10/2013 | | |
| JP | 2014125596 A | 7/2014 | | |
| KR | 10-2012-0034080 A | 4/2012 | | |
| WO | WO-2014050155 A1 * | 4/2014 | ............... | C08K 3/08 |

OTHER PUBLICATIONS

KR, Office Action for Korean application No. 10-2016-7032937, dated Oct. 27, 2017.
WO, International Search Report, dated Jul. 14, 2015.
CN, Office Action for Chinese application No. 201580028049.0, dated Dec. 24, 2018.
CN, Office Action for Chinese application No. 201580028049.0, dated Jul. 16, 2019.

* cited by examiner

THERMALLY AND ELECTRICALLY CONDUCTIVE ADHESIVE COMPOSITION

TECHNICAL FIELD

The present invention relates to a thermally and electrically conductive adhesive composition.

BACKGROUND ART

Recently, the demand for miniaturized and sophisticated electronic components, for example, power devices or light-emitting diodes (LED) has rapidly increased. As semiconductor elements which can suppress power loss and can highly efficiently achieve power conversion, power devices have become widespread in the fields of electric cars, hybrid cars, quick chargers, etc., and further, the demand therefor is expected to be increased in the new energy fields of photovoltaic power generation systems, mega solar systems, etc.

On the other hand, LED elements having advantages of long service life, small size, and low power consumption as compared with incandescent bulbs have rapidly become widespread in various fields of illumination lamps, cellular phones, liquid crystal panels, automobiles, signal lamps, street lamps, image display devices, etc.

In the advancement of miniaturization and sophistication of electronic components as described above, there is a tendency of increasing the amount of heat generation of semiconductor elements. However, when electronic components are exposed to a high temperature environment for a long period of time, the original function cannot be exhibited, and also the service life is shortened. Therefore, in general, as a joining material for die bonding (a die-bonding material), a joining material having high heat dissipation properties is used for efficiently diffusing heat generated from a semiconductor element. In general, a joining material needs to have a function to efficiently release heat generated from a semiconductor element to a substrate or a housing, and is required to have high heat dissipation properties, although depending on the application thereof.

In this manner, since a joining material to be used for electronic components is required to have high heat dissipation properties, high-temperature lead solder containing much lead or gold-tin solder containing much gold have been widely used. However, high-temperature lead solder has a problem that it contains lead which is considered to be harmful to the human body. Due to this, recently, development of lead-free techniques has been actively performed, and research on conversion to lead-free solder has been actively performed. On the other hand, gold-tin solder contains expensive gold, and therefore has a problem of cost.

In such circumstances, recently, as a potent substitute material substituting for high-temperature lead solder or gold-tin solder, an isotropic electrically conductive adhesive (hereinafter simply referred to as "electrically conductive adhesive") has attracted attention. The electrically conductive adhesive is a composite of metal particles (for example, silver, nickel, copper, aluminum, or gold) having a function of electrical conductivity and the like, and an organic adhesive (for example, an epoxy resin, a silicone resin, an acrylic resin, or a urethane resin) having an adhesive function, and various metal particles and organic adhesives are used. The electrically conductive adhesive is a liquid at room temperature and therefore is easy to use, and also is free of lead and inexpensive, and thus is a potent substitute material for high-temperature lead solder or gold-tin solder, so that its market is expected to expand greatly.

As described above, the electrically conductive adhesive as the substitute material for solder is required to have high heat dissipation properties as well as electrical conductivity. The organic adhesive which is a raw material of the electrically conductive adhesive basically has a lower thermal conductivity than metals, and therefore, by blending a thermally conductive filler, a heat dissipation function is imparted. The focus of the technical development of the electrically conductive adhesive is how the thermal resistance of the electrically conductive adhesive is decreased to effectively release the generated heat.

Conventionally, as for an electrically conductive adhesive having improved thermal conductivity, for example, Patent Document 1 proposes a highly thermally and electrically conductive composition containing at least 5 to 80 wt % of a pitch-based graphitized carbon fiber filler having an average fiber diameter of 0.1 to 30 μm, an aspect ratio of 2 to 100, an average fiber length of 0.2 to 200 μm, and a true density of 2.0 to 2.5 g/cc, 15 to 90 wt % of a metal fine particle filler having an average particle diameter of 0.001 to 30 μm, and 5 to 50 wt % of a binder resin as solid components in the composition.

Further, Patent Document 2 proposes an electrically conductive composition containing an epoxy resin as a base material resin, a phenol-based curing agent as a curing agent, a urethane-modified epoxy resin as a flexibilizer, and further a powder of gold, silver, copper, iron, aluminum, aluminum nitride, alumina, crystalline silica, or the like as a thermally conductive filler.

Further, Patent Document 3 reports an adhesive containing a resin component, a highly thermally conductive fibrous filler, and a highly thermally conductive spherical filler composed of at least one member selected from the group consisting of silver, gold, platinum, aluminum nitride, silicon oxide, aluminum oxide, and carbon black, wherein with respect to 100 parts by volume of the resin component, the highly thermally conductive fibrous filler is contained in an amount of 0.1 to 20 parts by volume and the highly thermally conductive spherical filler is contained in an amount of to 200 parts by volume.

CITED REFERENCES

Patent Documents

Patent Document 1: JP-A-2008-186590
Patent Document 2: JP-A-6-322350
Patent Document 3: JP-A-2009-84510

DISCLOSURE OF THE INVENTION

Problems to be Solved by the Invention

As described above, it is an important issue to take appropriate measures for heat dissipation in the advancement of miniaturization and sophistication of electronic components, and development of an electrically conductive adhesive having both heat dissipation properties and electrical conductivity has been awaited. In view of this, an object of the present invention is to provide a thermally and electrically conductive adhesive composition which is used as a die-bonding material and has high thermal conductivity and stable electrical conductivity.

Means for Solving the Problems

As a result of studies for achieving the above object, the present inventors found that the above problem can be solved by blending a specific epoxy resin, a specific reactive diluent, and a specific curing agent in specific amounts as well as specifying the average particle diameter of particularly a silver powder serving as an electrically conductive filler among the components constituting the electrically conductive adhesive composition and also specifying the content of the silver powder, and thus, completed the present invention.

That is, the present invention is as follows.

1. A thermally and electrically conductive adhesive composition, comprising (A) an electrically conductive filler, (B) an epoxy resin, (C) a reactive diluent, and (D) a curing agent, wherein the electrically conductive filler (A) is a silver powder having an average particle diameter of 1 to 10 µm, and the content of the electrically conductive filler (A) is in a range of 85 to 94 mass % with respect to the total amount of the thermally and electrically conductive adhesive composition, the epoxy resin (B) has two or more epoxy functional groups and aromatic rings in each molecule, and the content of the epoxy resin (B) is in a range of 1 to 8 mass % with respect to the total amount of the thermally and electrically conductive adhesive composition, the reactive diluent (C) is a compound having two or more glycidyl ether functional groups in an aliphatic hydrocarbon chain and also having a molecular weight of 150 to 600, and the content of the reactive diluent (C) is in a range of 0.2 to 5 mass % with respect to the total amount of the thermally and electrically conductive adhesive composition, and the curing agent (D) is a compound having two or more phenol functional groups in each molecule, a compound having two or more aniline functional groups in each molecule, or a mixture of these compounds, and the content of the curing agent (D) is in a range of 0.2 to 3 mass % with respect to the total amount of the thermally and electrically conductive adhesive composition.

2. The thermally and electrically conductive adhesive composition as described in 1 above, further comprising a rubber-based resin (E) which does not exhibit reactivity with the curing agent (D) in an amount ranging from 0.2 to 2 mass % with respect to the total amount of the thermally and electrically conductive adhesive composition.

3. The thermally and electrically conductive adhesive composition as described in 1 above, wherein the TI value (thixotropic index) calculated from the measurement values at rotation speeds of 0.5 rpm and 5 rpm using a rotational viscometer of the thermally and electrically conductive adhesive composition excluding the electrically conductive filler (A) in the composition is from 1 to 3.

Effect of the Invention

According to the present invention, a thermally and electrically conductive adhesive composition which has heat dissipation properties and stable electrical conductivity is provided at a low price.

EMBODIMENTS FOR CARRYING OUT THE INVENTION

The thermally and electrically conductive adhesive composition (hereinafter simply referred to as "adhesive composition") of the present invention contains the above-mentioned electrically conductive filler (A), epoxy resin (B), reactive diluent (C), and curing agent (D) as essential components. In the adhesive composition of the present invention, necking of the electrically conductive filler (A) is promoted, and at the time of thermal curing, the dispersed electrically conductive filler particles are fused with each other so as to sufficiently form a network of the electrically conductive filler for transporting heat, and as a result, high heat dissipation properties are exhibited.

Incidentally, the electrically conductive filler (A) to be used in the present invention is a silver powder having an average particle diameter of 1 to 10 µm, however, such a silver powder of micron order is conventionally considered that neck formation is not possible for the reason that as compared with a silver powder of submicron order or smaller, there are many voids between silver powder particles or within the silver powder, and therefore, not only is the surface likely to be oxidized, but also the surface activity is low. If it becomes possible to use a silver powder of micron order, high electrical conductivity and high thermal conductivity by necking are obtained, and also shrinkage after curing the adhesive is suppressed as compared with the silver powder of submicron order or less, and therefore, this is particularly advantageous in the point that high adhesion to an adherend material is obtained. Further, the tap density of such a silver powder of micron order is preferably from 4 to 8 g/cm$^3$. The tap density is obtained by performing measurement according to, for example, Metallic powders—Determination of tap density described in JIS standard Z 2512:2012 and then performing calculation.

In view of this, as a result of intensive studies, the present inventors found that neck formation of a silver powder of micron order becomes possible by using a specific epoxy resin (B), a specific reactive diluent (C), and a specific curing agent (D) in specific amounts in combination, although the reason is unclear. Such a finding is unknown in the conventional art.

Hereinafter, the respective components: electrically conductive filler (A), epoxy resin (B), reactive diluent (C), and curing agent (D) will be described in detail.

As the electrically conductive filler (A), a silver powder having an average particle diameter of micron order, that is, 1 to 10 µm is used. When the average particle diameter of the silver powder exceeds 10 µm, voids between silver powder particles or within the silver powder are large, and even if necking occurs, it is difficult to obtain high electrical conductivity, and therefore, such a diameter is not preferred. When the average particle diameter of the silver powder is less than 1 shrinkage after curing the adhesive is not suppressed, and therefore, the adhesion to an adherend material is deteriorated. The average particle diameter of the silver powder is more preferably from 1.5 µm to 8 µm. Incidentally, the average particle diameter of the silver powder refers to a value measured by laser diffractometry.

In the present invention, the average particle diameter of the silver powder serving as the electrically conductive filler (A) is defined as a 50% average particle diameter (D50) in a particle diameter distribution measured using a laser diffraction-scattering particle size analyzer. For example, it can be measured using a laser diffraction-scattering particle size analyzer MT-3000 manufactured by Nikkiso Co., Ltd.

The shape of the silver powder is not particularly limited, and examples thereof include a spherical shape, a flaky shape, a foil shape, and a dendritic shape, however, in general, a flaky shape or a spherical shape is selected. Further, as the silver powder, other than a pure silver powder, metal particles which are surface-coated with silver or a mixture thereof can be used. The silver powder can be obtained as a commercially available product or can be produced using a known method. The method for producing the silver powder is not particularly limited, and any method such as a mechanical pulverization method, a reduction method, an electrolytic method, or a gas phase method may be used.

The surface of the silver powder serving as the electrically conductive filler (A) may be coated with a coating agent. For example, a coating agent containing a carboxylic acid is exemplified. By using the coating agent containing a carboxylic acid, the heat dissipation properties of the adhesive composition can be further more improved.

The carboxylic acid contained in the coating agent is not particularly limited, and examples thereof include monocarboxylic acids, polycarboxylic acids, and oxycarboxylic acids.

Examples of the monocarboxylic acids include aliphatic monocarboxylic acids having 1 to 24 carbon atoms such as acetic acid, propionic acid, butyric acid, valeric acid, caprylic acid, caproic acid, capric acid, lauric acid, myristic acid, palmitic acid, stearic acid, arachidic acid, behenic acid, and lignoceric acid. Further, an unsaturated aliphatic carboxylic acid having 4 to 24 carbon atoms such as oleic acid, linoleic acid, α-linolenic acid, γ-linolenic acid, dihomo-γ-linolenic acid, elaidic acid, arachidonic acid, erucic acid, nervonic acid, stearidonic acid, eicosapentaenoic acid, or docosahexaenoic acid may be used. In addition, an aromatic monocarboxylic acid having 7 to 12 carbon atoms such as benzoic acid or naphthoic acid, or the like can also be used.

Examples of the polycarboxylic acids include aliphatic polycarboxylic acids having 2 to 10 carbon atoms such as oxalic acid, malonic acid, succinic acid, glutaric acid, adipic acid, azelaic acid, and sebacic acid; aliphatic unsaturated polycarboxylic acids having 4 to 14 carbon atoms such as maleic acid, fumaric acid, itaconic acid, sorbic acid, and tetrahydrophthalic acid; and aromatic polycarboxylic acids such as phthalic acid and trimellitic acid.

Examples of the oxycarboxylic acids include aliphatic hydroxy monocarboxylic acids such as glycolic acid, lactic acid, oxybutyric acid, and glyceric acid; aromatic hydroxy monocarboxylic acids such as salicylic acid, oxybenzoic acid, and gallic acid; and hydroxypolycarboxylic acids such as tartaric acid, citric acid, and malic acid.

In the coating agent for treating the surface of the silver powder, a higher fatty acid having 10 or more carbon atoms or a derivative thereof can be included for reducing aggregation of the silver powder. Examples of such a higher fatty acid include lauric acid, myristic acid, palmitic acid, stearic acid, oleic acid, linoleic acid, linolenic acid, and lignoceric acid. Examples of the derivative of such a higher fatty acid include higher fatty acid metal salts, higher fatty acid esters, and higher fatty acid amides.

The carboxylic acid to be contained in the coating agent may be a mixture of two or more types of the above-mentioned carboxylic acids. Further, among the above-mentioned carboxylic acids, higher fatty acids which are saturated fatty acids or unsaturated fatty acids having 12 to 24 carbon atoms are preferred.

The coating of the surface of the silver powder with the coating agent may be performed by utilizing a known method such as a method in which both members are stirred and kneaded in a mixer or a method in which the silver powder is impregnated with a solution of a carboxylic acid, followed by volatilization of the solvent.

In the adhesive composition of the present invention, another electrically conductive filler can be used in combination as long as the effect of the present invention is not impaired. Such an electrically conductive filler is not particularly limited as long as it has electrical conductivity, however, a metal, a carbon nanotube, or the like is preferred.

As the metal, all types of metal powders to be used as a common conductive body can be utilized. Examples thereof include simple substances such as nickel, copper, silver, gold, aluminum, chromium, platinum, palladium, tungsten, and molybdenum, alloys composed of two or more metals among these, materials coated with any of these metals, and compounds of any of these metals having favorable electrical conductivity.

The electrically conductive filler (A) is contained in an amount ranging from 85 to 94 mass % with respect to the total amount of the adhesive composition. When the content of the electrically conductive filler (A) is less than 85 mass %, the necking rate is decreased, or it becomes difficult to suppress shrinkage after curing the adhesive, and therefore, the thermal conductivity or electrical conductivity is decreased, and also the adhesion to an adherend material is deteriorated. On the other hand, when the content exceeds 94 mass %, the adhesive composition becomes difficult to transform into a paste, and also sufficient adhesion to an adherend material is deteriorated. The content of the electrically conductive filler (A) is preferably from 88 to 94 mass %, more preferably from 89 to 93 mass %.

The epoxy resin (B) is a compound having two or more epoxy functional groups and aromatic rings in each molecule, and a liquid epoxy resin is used. One type may be used or two or more types may be used in combination. As a specific example of such a liquid epoxy resin, an epoxy resin obtained by condensation of epichlorohydrin and a polyvalent phenol such as a bisphenol or a polyhydric alcohol, and for example, glycidyl ether-type epoxy resins such as bisphenol A-type, brominated bisphenol A-type, hydrogenated bisphenol A-type, bisphenol F-type, bisphenol S-type, bisphenol AF-type, biphenyl-type, naphthalene-type, fluorene-type, novolac-type, phenol novolac-type, o-cresol novolac-type, tris(hydroxyphenyl)methane-type, and tetraphenylolethane-type can be exemplified. Additional examples thereof include glycidyl ester-type epoxy resins obtained by condensation between epichlorohydrin and a carboxylic acid such as a phthalic acid derivative or a fatty acid, and further include epoxy resins modified by various methods, however, the epoxy resin is not limited thereto. In particular, bisphenol-type epoxy resins are preferably used, and above all, bisphenol A-type and bisphenol F-type epoxy resins are preferably used.

The epoxy resin (B) is contained in an amount ranging from 1 to 8 mass % with respect to the total amount of the adhesive composition. When the content of the epoxy resin (B) is less than 1 mass %, the adhesive force is decreased, and the connection reliability is deteriorated. On the other hand, when the content exceeds 8 mass %, it becomes difficult to form a network by necking of the electrically conductive filler, and thus, stable electrical conductivity and thermal conductivity cannot be obtained. The content of the epoxy resin (B) is preferably from 1.4 to 3.5 mass %.

The reactive diluent (C) is a compound having two or more glycidyl ether functional groups in an aliphatic hydrocarbon chain and also having a molecular weight of 150 to 600. Incidentally, in addition to the glycidyl ether functional groups, another polymerizable functional group, for example, an alkenyl group such as vinyl or allyl, or an unsaturated group such as acryloyl or methacryloyl may be included. When the molecular weight is less than 150, the reactive diluent volatilizes before a curing reaction proceeds, and therefore, assumed adhesive properties cannot be obtained, and on the other hand, when the molecular weight exceeds 600, the reactivity of the reactive diluent (C)

becomes slow, and an expected effect is difficult to obtain. Further, the molecular weight is preferably from 200 to 500.

Examples of such a reactive diluent include diepoxide compounds such as ethylene glycol diglycidyl ether, propylene glycol diglycidyl ether, butanediol diglycidyl ether, neopentyl glycol diglycidyl ether, and cyclohexanedimethanol diglycidyl ether; monoepoxide compounds such as phenyl glycidyl ether and butylphenyl glycidyl ether; and triepoxide compounds such as trimethylolpropane triglycidyl ether and glycerin triglycidyl ether.

Above all, preferably, from the viewpoint of enhancing the effect of the present invention, butanediol diglycidyl ether, cyclohexanedimethanol diglycidyl ether, butylphenyl glycidyl ether, and the like are preferred.

The reactive diluent (C) is contained in an amount ranging from 0.2 to 5 mass % with respect to the total amount of the adhesive composition. When the content of the reactive diluent (C) is less than 0.2 mass %, it is difficult to disperse the resin component, and the dispersion is not uniform, and therefore, the adhesion to an adherend material is deteriorated. On the other hand, when the content exceeds 5 mass %, the resin after curing becomes brittle, and therefore, the adhesion to an adherend material is deteriorated, and also the electrical conductivity may be decreased due to rupture or the like. The content of the reactive diluent (C) is preferably from 0.3 to 1.2 mass %.

The curing agent (D) is a compound having two or more phenol functional groups in each molecule, a compound having two or more aniline functional groups in each molecule, or a mixture of these compounds.

Examples of the compound having two or more phenol functional groups in each molecule include the following compound.

[Chem. 1]

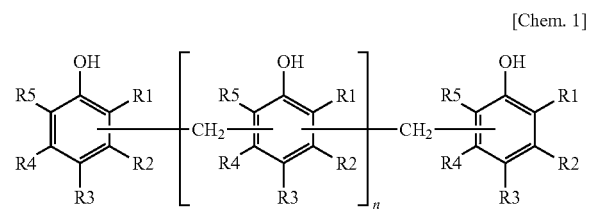

In the formula, R1 to R5 each independently represent an alkyl group having 1 to 5 carbon atoms, an allyl group, or a hydrogen atom, and n represents an integer of 0 or more.

As such a compound having two or more phenol functional groups in each molecule, a commercially available product can be used, and examples thereof include MEH-8000 series (8000H, 8005, 8010, and 8015) manufactured by Meiwa Plastic Industries, Ltd. Above all, from the viewpoint of enhancing the effect of the present invention, MEH-8000H (a compound represented by the above formula wherein R1 to R5 each represent hydrogen or an allyl group, and n represents 0 to 3) is preferred.

Further, preferred examples of the curing agent having two or more aniline functional groups in each molecule include compounds represented by the following general formula (I), (II), or (III). It is also possible to combine two or more types of the compounds represented by the following general formula (I), (II), or (III) as needed. Incidentally, examples of the "lower alkyl group" as used herein include a linear, branched, or cyclic alkyl group having 1 to 6 carbon atoms, and a linear or branched alkyl group having 1 to 3 carbon atoms is preferred, and a methyl group or an ethyl group is particularly preferred.

In particular, in the group of compounds represented by the following general formula (I), (II), or (III), diaminodiphenyl sulfone represented by the formula wherein X is —SO$_2$— and a derivative thereof is preferably used because a moderate curing retarding effect is obtained, and also sintering growth and network formation of the electrically conductive filler by an interaction with the electrically conductive filler are promoted, and 4,4'-diaminodiphenyl sulfone and 3,3'-diaminodiphenyl sulfone is most preferably used because the above-mentioned effect is exhibited most strongly. Incidentally, another known curing agent may be used in combination as long as the effect of the present invention is not impaired.

[Chem. 2]

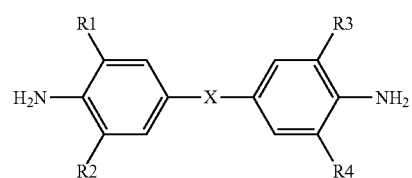

In the formula, X represents —SO$_2$—, —CH$_2$—, or —O—, and R1 to R4 each independently represent a hydrogen atom or a lower alkyl group.

[Chem. 3]

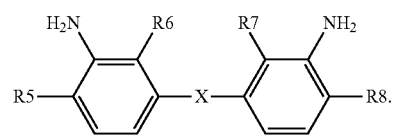

In the formula, X represents —SO$_2$—, —CH$_2$—, or —O—, and R5 to R8 each independently represent a hydrogen atom or a lower alkyl group.

[Chem. 4]

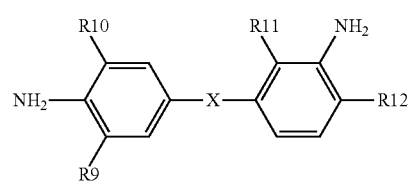

In the formula, X represents —SO$_2$—, —CH$_2$—, or —O—, and R9 to R12 each independently represent a hydrogen atom or a lower alkyl group.

The curing agent (D) is contained in an amount ranging from 0.2 to 3 mass % with respect to the total amount of the adhesive composition. When the content of the curing agent (D) is less than 0.2 mass %, curing is insufficient and heat resistance may sometimes be poor. Further, even if curing is sufficient, the balance between the curing rate of the resin and the rate of network formation by necking through sintering of the electrically conductive filler becomes inappropriate, and therefore, the electrical conductivity and thermal conductivity may be decreased. On the other hand, when the content exceeds 3 mass %, the unreacted curing agent remains and the adhesion to an adherend material is deteriorated, and therefore, not only are the electrical properties deteriorated, but also the balance between the curing rate of the resin and the rate of network formation by necking through sintering of the electrically conductive filler becomes inappropriate, and therefore, the electrical conductivity or thermal conductivity may be decreased. The content of the curing agent (D) is preferably from 0.2 to 2.5 mass %, more preferably from 0.3 to 2 mass %.

In the present invention, it is preferred that the rubber-based resin (E) which does not exhibit reactivity with the curing agent is further contained in an amount ranging from 0.2 to 2 mass % with respect to the total amount of the adhesive composition. By blending this rubber-based resin (E), necking of the electrically conductive filler (A) is further promoted, and high heat dissipation properties can be exhibited.

Examples of the rubber-based resin (E) include acid-modified rubbers. Above all, a liquid rubber-based resin which is in a liquid form at room temperature is preferred, and an acrylonitrile butadiene rubber which is in a liquid form and has a carboxyl group is more preferred. Examples of the acrylonitrile butadiene rubber having a carboxyl group include compounds represented by the following formula.

[Chem. 5]

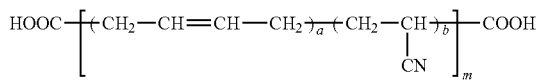

In the formula, m represents an integer of 5 to 50, a and b each independently represent an integer of 1 or more. The ratio of a to b (a/b) is preferably from 95/5 to 50/50. As such a compound, for example, Hycar CTBN-2009×162, CTBN-1300×31, CTBN-1300×8, CTBN-1300×13, CTBN-1009SP-S, CTBNX-1300×9, ATBN-1300×16, ATBN-1300×21, ATBN-1300×35, ATBN-1300×42, and ATBN-1300×45 (all are manufactured by Ube Industries, Ltd.) can be obtained as commercially available products. Preferably, CTBN series are used.

The content of the liquid rubber-based resin (E) is preferably from 0.2 to 2 mass %, more preferably from 0.2 to 1.5 mass %, and most preferably from 0.4 to 1.1 mass % with respect to the total amount of the adhesive composition.

The adhesive composition of the present invention needs to be in an uncured or semi-cured state before starting sintering the electrically conductive filler (A) at the time of thermal curing. If the adhesive composition is in a completely cured state before starting sintering the electrically conductive filler (A) at the time of thermal curing, favorable thermal conductivity cannot be obtained.

Here, the phrase "before starting sintering the electrically conductive filler (A) at the time of thermal curing" refers to a state after heating is started when the adhesive composition is thermally cured and before the electrically conductive filler (A) is sintered and the average particle diameter grows. Further, the phrase "the adhesive composition is in an uncured state" refers to that the adhesive composition is in a state where substantially the entire adhesive composition is dissolved in a solvent (tetrahydrofuran) which can dissolve the adhesive composition. In addition, the phrase "the adhesive composition is in a semi-cured state" refers to that the curing of the adhesive composition is in an intermediate stage, and curing can be allowed to further proceed. The adhesive composition in a semi-cured state is in a state where the adhesive composition is partially dissolved in a solvent (tetrahydrofuran) which can dissolve the adhesive composition.

In the present invention, it is particularly preferred that the curing rate of the adhesive composition when the average particle diameter growth rate of the electrically conductive filler (A) after starting sintering the electrically conductive filler at the time of thermal curing has reached 30% is 50% or less. When the curing rate is higher than 50%, high thermal conductivity may not be able to be obtained.

The "necking" as used herein refers to a state where the electrically conductive filler particles in the cured body of the adhesive composition are not merely in contact with each other, but are connected and bound to each other by sintering at least partially, and the "necking rate" is the ratio of particles having been necked, which is evaluated by observation of an SEM image of the vertical cross section of the cured body of the adhesive composition after a heat treatment at 200° C. for 1 hour. Specifically, the necking rate is a numerical value obtained by observing a 30 µm square image of a substantially central portion of a cross-sectional image, and dividing the sum of the number of particles connected to each electrically conductive filler particle (1+the number of connected particles) by the number of electrically conductive filler particles (the following formula). For example, in the case where there are 100 electrically conductive filler particles in an observation image, and the number of particles to which each of the particles is connected is all 2, the sum of the particles connected to each electrically conductive filler particle comes to 300. In this case, the necking rate is 300%.

Necking rate (%)=100×[1+the sum of the particles connected to each electrically conductive filler particle]/[the number of electrically conductive filler particles] [Formula]

In the present invention, by using the epoxy curing agent, it becomes possible to arbitrarily adjust the curing rate of the adhesive composition. As the epoxy curing agent, curing catalysts such as resol-type phenol resins, novolac-type phenol resins, acid anhydrides, tertiary amines, and triphenylphosphines, anionic polymerizable curing agents such as dicyandiamides, hydrazines, and aromatic diamines, organic peroxides, and the like can be exemplified, however, in particular, resol-type phenol resins are preferably used. The resol-type phenol resin is a resin produced by a reaction between a phenol and an aldehyde, and has a function to achieve curing by reacting its hydroxy group with an epoxy group to crosslink a molecular chain of an epoxy resin. Only one type epoxy curing agent may be used, or two or more types of epoxy curing agents may be used in combination.

The blending amount of the resol-type phenol resin is not limited and may be determined as appropriate according to the type or amount of the epoxy resin, or the like, however, in the case of using the resol-type phenol resin, the blending amount is generally from 0.1 to 4.0 mass % with respect to the total amount of the adhesive composition of the present invention.

It is also possible to blend a curing accelerator in the adhesive composition of the present invention. Examples of the curing accelerator include imidazoles such as 2-phenyl-4,5-dihydroxymethylimidazole, 2-phenyl-4-methyl-5-hydroxymethylimidazole, 2-methyl-4-methylimidazole, and 1-cyano-2-ethyl-4-methylimidazole, tertiary amines, triphenylphosphines, urea-based compounds, phenols, alcohols, and carboxylic acids. Only one type of curing accelerator may be used, or two or more types of curing accelerators may be used in combination.

The blending amount of the curing accelerator is not limited and may be determined as appropriate, however, in the case of using the curing accelerator, the blending amount is generally from 0.1 to 2.0 mass % with respect to the total amount of the adhesive composition of the present invention.

It is also possible to blend a solvent in the adhesive composition of the present invention. Examples of the solvent include organic solvents such as butyl carbitol, butyl carbitol acetate, ethyl carbitol, ethyl carbitol acetate, butyl cellosolve, butyl cellosolve acetate, ethyl cellosolve, ethyl cellosolve acetate, γ-butyrolactone, isophorone, glycidyl phenyl ether, and triethylene glycol dimethyl ether. Only one type of solvent may be used, or two or more types of solvents may be used in combination.

The blending amount of the solvent is not limited and may be determined as appropriate, however, in the case of using the solvent, the blending amount is generally from 0.1 to 5.0 mass % with respect to the total amount of the adhesive composition of the present invention.

In the adhesive composition of the present invention, as another additive, an antioxidant, a UV absorber, a tackifier, a dispersant, a coupling agent, a toughness imparting agent, an elastomer, or the like can be blended as appropriate within a range that does not impair the effect of the present invention.

The adhesive composition of the present invention can be obtained by mixing and stirring the above-mentioned component (A), component (B), component (C), component (D), and according to need, component (E), and another component in an arbitrary order. As a dispersing method, a system of a two roll, a three roll, a sand mill, a roll mill, a ball mill, a colloid mill, a jet mill, a bead mill, a kneader, a homogenizer, a propellerless mixer, or the like can be adopted.

Incidentally, in the case where the adhesive composition of the present invention uses the component (E), by mixing the component (A) and the component (E) in advance, and thereafter mixing and stirring the other various components, necking of the electrically conductive filler (A) is further promoted, although the reason is unclear, so that high thermal conductivity is obtained and high heat dissipation can be exhibited.

The viscosity of the adhesive composition prepared as described above when excluding the electrically conductive filler (A) therein is measured using a rotational viscometer. Incidentally, in the present invention, the viscosity is a value measured at a temperature of 25° C. using a cone-plate type viscometer as the rotational viscometer at a specific rotation speed (rpm) using a 3°×R14 cone-plate.

Further, it is preferred that the TI value (thixotropic index) calculated from measurement values at rotation speeds of 0.5 rpm and 5 rpm using a rotational viscometer of the adhesive composition prepared as described above when excluding the electrically conductive filler (A) therein is from 1 to 3. When having such a TI value, not only is the workability at the time of preparing a paste improved, but also the electrically conductive filler and the resin are appropriately dispersed, and therefore, necking of the electrically conductive filler at the time of thermal curing is promoted, and thus, an effect of obtaining higher thermal conductivity and electrical conductivity is exhibited. Incidentally, in the present invention, the TI value is a value calculated by dividing the measurement value at a rotation speed of 0.5 ppm of the above-mentioned rotational viscometer by the measurement value at a rotation speed of 5 ppm of the above-mentioned rotational viscometer.

EXAMPLES

Hereinafter, the present invention will be further specifically described by way of Examples, however, the present invention is not limited to these Examples.

Examples 1 to 9 and Comparative Examples 1 to 3

A. Preparation of Adhesive Composition

The respective materials described in Table 1 were kneaded using a three roll, whereby an adhesive composition having a composition shown in Table 1 was prepared (the numerical value of each material indicates the mass % with respect to the total mass of the adhesive composition). The materials used are as follows. Incidentally, as for the order that the materials were kneaded, first, the component (A) and the component (E) were kneaded, and subsequently, the other various components were mixed and kneaded so that the respective components were uniformly dispersed. The resulting kneaded material was heated to 200° C. for 1 hour, and then left to cool to room temperature, whereby a cured body of the adhesive composition was obtained.

(A) Electrically Conductive Filler
   silver powder (average particle diameter: 5.0 μm, manufactured by Tanaka Kikinzoku Kogyo K.K.), tap density: 6.5 g/cm$^3$
   silver powder (average particle diameter: 1.5 μm, manufactured by Tanaka Kikinzoku Kogyo K.K.), tap density: 4.7 g/cm$^3$
   silver powder (average particle diameter: 8.0 μm, manufactured by Tanaka Kikinzoku Kogyo K.K.), tap density: 4.2 g/cm$^3$ (B) Epoxy Resin
   bisphenol F-type epoxy resin (EPICRON EXA-830CRP, manufactured by DIC Corporation, in a liquid form at room temperature]
   phenol novolac-type epoxy resin (jER-152, manufactured by Mitsubishi Chemical Corporation, in a liquid form at room temperature)
   naphthalene-type epoxy resin (HP4032D, manufactured by DIC Corporation, in a liquid form at room temperature)

(C) Reactive Diluent
   1,4-butanediol diglycidyl ether (molecular weight: 202.25)
   1,4-cyclohexanedimethanol diglycidyl ether (molecular weight: 256.34)

(D) Curing Agent
   a compound having 2 or more phenol functional groups in each molecule (MEH8000H, manufactured by Meiwa Plastic Industries, Ltd.)
   a compound having 2 or more aniline functional groups in each molecule (4,4'-diaminodiphenyl sulfone, manufactured by Tokyo Chemical Industry Co., Ltd.)

(E) Liquid Rubber-Based Resin
   acrylonitrile-butadiene rubber having a carboxyl group (CTBN-1300×13NA, manufactured by Ube Industries, Ltd.)

(Curing Accelerator)
   toluene bis dimethyl urea (manufactured by Carbon Scientific Co., Ltd.)
   imidazole-based curing accelerator (2P4MHZ, manufactured by Shikoku Chemicals Corporation)

(Solvent)
  γ-butyrolactone
  N-methylpyrrolidone
(Others)
  core-shell particles (AC-3355, manufactured by Aica Kogyo Company, Limited)
  silane coupling agent (Z-6040, manufactured by Dow Corning Toray Co., Ltd.)

B. Evaluation of Physical Properties of Adhesive Composition

1. Viscosity

An adhesive composition was prepared excluding the electrically conductive filler (A), and the viscosity of the composition was measured. The viscosity was measured at a temperature of 25° C. using a cone-plate type viscometer as a rotational viscometer at a rotation speed of 0.5 ppm or 5 ppm using a 3°×R14 cone-plate. The result is shown in Table 1.

2. TI Value

An adhesive composition was prepared excluding the electrically conductive filler (A), and the TI value of the composition was measured. The TI value was calculated by dividing the measurement value at a rotation speed of 0.5 ppm of the above-mentioned rotational viscometer by the measurement value at a rotation speed of ppm of the above-mentioned rotational viscometer. The result is shown in Table 1.

3. Measurement of Thermal Conductivity

In order to evaluate the thermal conduction properties of the adhesive composition, the thermal conductivity of the adhesive composition was measured. The thermal conductivity λ (W/m·K) was determined by measuring a thermal diffusivity a in accordance with ASTM E1461 using a laser flash method thermal constant measuring system (TC-7000, manufactured by ULVAC-RIKO, Inc.), calculating a specific gravity d at room temperature by a pycnometer method, and measuring a specific heat Cp at room temperature in accordance with JIS K7123 using a differential scanning calorimeter (DSC7020, manufactured by Seiko Electronics Co., Ltd.), and then, performing calculation according to the following formula. The result is shown in Table 1.

$$\lambda = a \times d \times Cp$$

4. Measurement of Volume Resistivity

In order to evaluate the electrical properties of the adhesive composition, the volume resistivity of the adhesive composition was measured. The volume resistivity K ($\times 10^{-4}$ Ω·cm) was determined by measuring the emerging resistance R by a DC four-terminal method using a DC voltage source monitor (R6243, manufactured by Advantest Corporation), and then, performing calculation according to the following formula from the width W, thickness T, and length L of a measurement sample. The result is shown in Table 1.

$$K = L/(R \times W \times T)$$

5. Measurement of Necking Rate

After the adhesive composition was applied onto a 2 mm square silver-plated copper substrate by a dispenser, and thereafter, a 2 mm square silicon substrate was placed thereon so as to interpose the adhesive composition between the silicon substrate and the copper substrate. After performing a heat treatment at 200° C. for 1 hour, the necking rate was evaluated by observation of an SEM image of the vertical cross section of the cured body of the adhesive composition. Specifically, a 30 μm square image was observed at arbitrary 5 sites of a substantially central portion of a cross-sectional image of the cured body of the adhesive composition, and the necking rate was calculated from the average of numerical values obtained by dividing the sum of the number of particles connected to each electrically conductive filler particle (1+the number of connected particles) by the number of electrically conductive filler particles (the following formula). The calculation result is shown in Table 1.

Necking rate (%)=100×[1+the sum of the particles connected to each electrically conductive filler particle]/[the number of electrically conductive filler particles]  [Formula]

TABLE 1

| | | | Ex. 1 | Ex. 2 | Ex. 3 | Ex. 4 | Ex. 5 | Ex. 6 | Ex. 7 | Ex. 8 | Ex. 9 |
|---|---|---|---|---|---|---|---|---|---|---|---|
| (A) | Silver powder | Average particle diameter 5 μm | 91.6 | 91.6 | 91.6 | 91.6 | 91.6 | 91.6 | | 85.3 | 91.6 |
| | | Average particle diameter 1.5 μm | | | | | | | 13.5 | | |
| | | Average particle diameter 8 μm | | | | | | | 80.0 | | |
| (B) | Epoxy resin | EXA-830CRP | 3.1 | 2.2 | 1.6 | 1.3 | 2.5 | 2.2 | 1.4 | 4.8 | 3.1 |
| | | JER-152 | | 0.9 | 1.1 | 1.4 | 1.0 | 0.9 | | | |
| | | HP4032D | | | | | | | | | |
| (C) | Reactive diluent | 1,4-Butanediol diglycidyl ether | 1.0 | 1.0 | 1.2 | 1.5 | 1.1 | 1.0 | 0.5 | 4.0 | |
| | | 1,4-Cyclohexanedimethanol diglycidyl ether | | | | | | | | | 1.0 |
| (E) | Liquid rubber-based resin | CTBN1300x13NA | 0.5 | 0.5 | 0.6 | 0.8 | | 0.5 | 0.3 | 1.5 | 0.5 |
| | Core-shell particles | AC-3355 | 0.5 | 0.5 | 0.5 | | 0.5 | 0.5 | 0.2 | | 0.5 |
| (D) | Curing agent | MEH8000H | 0.4 | 0.4 | 0.4 | 0.4 | 0.4 | | 0.3 | | 0.4 |
| | | 4,4'-diaminodiphenyl sulfone | | | | | | 0.6 | | 1.5 | |
| | Curing accelerator | Toluene bis dimethyl urea | 0.3 | 0.3 | 0.3 | 0.3 | 0.3 | 0.2 | 0.2 | 0.6 | 0.3 |
| | | 2P4MHZ | 0.1 | 0.1 | 0.1 | 0.1 | 0.1 | | 0.1 | 0.3 | 0.1 |
| | Silane coupling agent | Z-6040 | 0.1 | 0.1 | 0.1 | 0.1 | 0.1 | 0.1 | 0.1 | 0.2 | 0.1 |

TABLE 1-continued

|  |  |  |  |  |  |  |  |  |  |  |
|---|---|---|---|---|---|---|---|---|---|---|
| Solvent | γ-butyrolactone | 2.4 | 2.4 | 2.5 | 2.5 | 2.4 | 2.4 | 3.4 | 1.8 | 2.4 |
|  | N-methylpyrrolidone |  |  |  |  |  |  |  |  |  |
| Viscosity | 0.5 rpm (Pa · s) | 11.0 | 15.0 | 11.6 | 4.8 | 2.2 | 12.8 | 12 | 2.5 | 11.7 |
|  | 5 rpm (Pa · s) | 6.4 | 9.4 | 7.2 | 4.3 | 1.8 | 6.5 | 8 | 2.0 | 7.2 |
| TI value | 0.5/5 rpm | 1.7 | 1.6 | 1.6 | 1.1 | 1.2 | 2.0 | 2 | 1.3 | 1.6 |
| Thermal conductivity | (W/m · K) | 67 | 55 | 38 | 30 | 21 | 63 | 73 | 19 | 56 |
| Volume resistivity | (×10$^4$ Ω · cm) | 0.5 | 0.5 | 0.6 | 0.5 | 0.5 | 0.5 | 0.4 | 0.8 | 0.6 |
| Necking rate | (%) | 260 | 220 | 185 | 175 | 170 | 225 | 255 | 150 | 240 |

|  |  |  | Ex. 10 | Ex. 11 | Comp. Ex. 1 | Comp. Ex. 2 | Comp. Ex. 3 |
|---|---|---|---|---|---|---|---|
| (A) | Silver powder | Average particle diameter 5 µm | 91.6 | 85.3 | 91.6 | 85.3 | 83.5 |
|  |  | Average particle diameter 1.5 µm |  |  |  |  |  |
|  |  | Average particle diameter 8 µm |  |  |  |  |  |
| (B) | Epoxy resin | EXA-830CRP | 2.1 | 7.0 | 2.7 | 0.8 | 9.1 |
|  |  | JER-152 | 0.8 |  | 1.1 | 0.8 |  |
|  |  | HP4032D | 1.0 |  |  |  |  |
| (C) | Reactive diluent | 1,4-Butanediol diglycidyl ether | 0.2 | 4.2 |  | 6.3 | 1.2 |
|  |  | 1,4-Cyclohexanedimethanol diglycidyl ether |  |  |  |  |  |
| (E) | Liquid rubber-based resin | CTBN1300x13NA | 0.5 | 0.3 | 0.6 | 0.5 | 0.5 |
|  | Core-shell particles | AC-3355 | 0.5 |  | 0.6 | 2.2 | 0.5 |
| (D) | Culing agent | MEH8000H | 0.4 | 1.5 | 0.5 | 0.5 | 2.5 |
|  |  | 4,4'-diaminodiphenyl sulfone |  |  |  |  |  |
|  | Curing accelerator | Toluene bis dimethyl urea | 0.3 | 0.2 | 0.3 | 0.2 | 0.3 |
|  |  | 2P4MHZ | 0.1 | 0.1 | 0.1 | 0.2 | 0.1 |
|  | Silane coupling agent | Z-6040 | 0.1 | 0.1 | 0.1 | 0.1 | 0.1 |
|  | Solvent | γ-butyrolactone | 1.8 | 1.3 | 2.4 | 3.1 | 2.2 |
|  |  | N-methylpyrrolidone | 0.6 |  |  |  |  |
|  | Viscosity | 0.5 rpm (Pa · s) | 27.0 | 3.8 | 289.0 | 10.5 | 6.8 |
|  |  | 5 rpm (Pa · s) | 10.0 | 2.5 | 251.8 | 2.6 | 5.2 |
|  | TI value | 0.5/5 rpm | 2.7 | 1.5 | 1.1 | 4.0 | 1.3 |
|  | Thermal conductivity | (W/m · K) | 58 | 17 | — | 3 | 5 |
|  | Volume resistivity | (×10$^4$ Ω · cm) | 0.5 | 1.5 | — | 7.0 | 2.4 |
|  | Necking rate | (%) | 215.0 | 160 | — | 101 | 130 |

From the above results, it was confirmed that the adhesive composition of the present invention has high thermal conductivity and stable electrical conductivity.

While the present invention has been described in detail with reference to specific embodiments, it is apparent to those skilled in the art that various changes and modifications can be made without departing from the spirit and scope of the present invention.

Incidentally, the present application is based on Japanese Patent Application (Japanese Patent Application No. 2014-111769) filed on May 29, 2014 and the entire contents of which are incorporated herein by reference.

The invention claimed is:

1. A thermally and electrically conductive adhesive composition, comprising (A) an electrically conductive filler, (B) an epoxy resin, (C) a reactive diluent, and (D) a curing agent, wherein the electrically conductive filler (A) is a pure silver powder having an average particle diameter of 1 to 10 µm, and the content of the electrically conductive filler (A) is in a range of 85 to 94 mass % with respect to the total amount of the thermally and electrically conductive adhesive composition, the epoxy resin (B) has two or more epoxy functional groups and aromatic rings in each molecule, and the content of the epoxy resin (B) is in a range of 1 to 8 mass % with respect to the total amount of the thermally and electrically conductive adhesive composition, the reactive diluent (C) is butanediol diglycidyl ether or cyclohexanedimethanol diglycidyl ether, and the content of the reactive diluent (C) is in a range of 0.3 to 1.2 mass % with respect to the total amount of the thermally and electrically conductive adhesive composition, and the curing agent (D) is a compound having two or more phenol functional groups in each molecule, a compound having two or more aniline functional groups in each molecule, or a mixture of these compounds, and the content of the curing agent (D) is in a range of 0.2 to 3 mass % with respect to the total amount of the thermally and electrically conductive adhesive composition.

2. The thermally and electrically conductive adhesive composition according to claim 1, further comprising a rubber-based resin (E) which does not exhibit reactivity with the curing agent (D) in an amount ranging from 0.2 to 2 mass % with respect to the total amount of the thermally and electrically conductive adhesive composition.

3. The thermally and electrically conductive adhesive composition according to claim 1, wherein the TI value (thixotropic index) calculated from the measurement values at rotation speeds of 0.5 rpm and 5 rpm using a rotational viscometer of the thermally and electrically conductive adhesive composition excluding the electrically conductive filler (A) in the composition is from 1 to 3.

* * * * *